US009276174B2

(12) United States Patent
Takao et al.

(10) Patent No.: US 9,276,174 B2
(45) Date of Patent: *Mar. 1, 2016

(54) SEMICONDUCTOR LIGHT EMITTING DEVICE AND FABRICATION METHOD OF THE SEMICONDUCTOR LIGHT EMITTING DEVICE

(71) Applicant: ROHM CO., LTD., Kyoto-fu (JP)

(72) Inventors: Masakazu Takao, Kyoto-fu (JP); Kazuhiko Senda, Kyoto-fu (JP)

(73) Assignee: ROHM CO., LTD., Kyoto-Fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/340,966

(22) Filed: Jul. 25, 2014

(65) Prior Publication Data

US 2014/0332840 A1    Nov. 13, 2014

Related U.S. Application Data

(62) Division of application No. 12/285,702, filed on Oct. 10, 2008, now Pat. No. 8,803,181.

(30) Foreign Application Priority Data

Oct. 11, 2007   (JP) ................... 2007-265763

(51) Int. Cl.
*H01L 33/38* (2010.01)
*H01L 33/00* (2010.01)
(Continued)

(52) U.S. Cl.
CPC .......... *H01L 33/387* (2013.01); *H01L 33/0079* (2013.01); *H01L 33/30* (2013.01); *H01L 33/40* (2013.01); *H01L 33/46* (2013.01)

(58) Field of Classification Search
CPC ............................... H01L 33/38; H01L 33/387
See application file for complete search history.

(56) References Cited

U.S. PATENT DOCUMENTS 5,233,444 A    8/1993   Musha et al.
5,309,001 A    5/1994   Watanabe et al.
(Continued)

FOREIGN PATENT DOCUMENTS

CN    1988195 A    6/2007
JP    05-145119 A    6/1993
(Continued)

OTHER PUBLICATIONS

Japanese Office Action issued on Jul. 21, 2015, with English translation.

*Primary Examiner* — Yu Chen
(74) *Attorney, Agent, or Firm* — Rabin & Berdo, P.C.

(57) ABSTRACT

A semiconductor light emitting device which can control of current density and can optimize current density and in which a rise in luminosity is possible, and a fabrication method of the semiconductor light emitting device are provided. The semiconductor light emitting device including: a semiconductor substrate structure including a semiconductor substrate, a first metal layer placed on a first surface of the semiconductor substrate, and a second metal layer placed on a second surface of the semiconductor substrate; and a light emitting diode structure including a third metal layer placed on the semiconductor substrate structure, a current control layer placed on the third metal layer and composed of a transparent insulating film and a current control electrode, an epitaxial growth layer placed on the current control layer, and a surface electrode placed on the epitaxial growth layer, wherein the semiconductor substrate structure and the light emitting diode structure are bonded by using the first metal layer and the third metal layer.

24 Claims, 7 Drawing Sheets

(51) Int. Cl.
*H01L 33/46* (2010.01)
*H01L 33/30* (2010.01)
*H01L 33/40* (2010.01)

(56) References Cited

U.S. PATENT DOCUMENTS

| | | |
|---|---|---|
| 5,376,580 A | 12/1994 | Kish et al. |
| 6,784,462 B2 | 8/2004 | Schubert |
| 7,439,550 B2 | 10/2008 | Tomioka et al. |
| 2003/0222269 A1 | 12/2003 | Lin et al. |
| 2004/0211968 A1 | 10/2004 | Lin et al. |
| 2005/0142677 A1 | 6/2005 | Kon et al. |
| 2005/0214965 A1* | 9/2005 | Park et al. ............... 438/33 |
| 2007/0145381 A1 | 6/2007 | Unno et al. |
| 2008/0173885 A1 | 7/2008 | Kuromizu |
| 2008/0265267 A1 | 10/2008 | Unno |
| 2009/0206354 A1 | 8/2009 | Kitano et al. |

FOREIGN PATENT DOCUMENTS

| | | |
|---|---|---|
| JP | 05-243612 A | 9/1993 |
| JP | 06-005921 A | 1/1994 |
| JP | 06-302857 | 10/1994 |
| JP | H09-36431 A | 2/1997 |
| JP | 2002-344016 A | 11/2002 |
| JP | 2004-296979 A | 10/2004 |
| JP | 2005-129682 A | 5/2005 |
| JP | 2005-513787 A | 5/2005 |
| JP | 2007-221029 A | 8/2007 |
| JP | 2009-076490 A | 4/2009 |

* cited by examiner

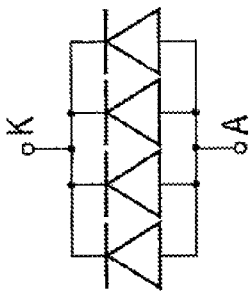
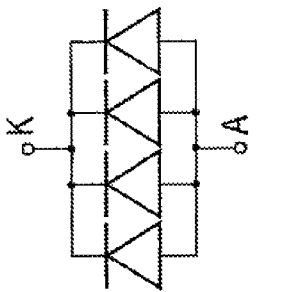
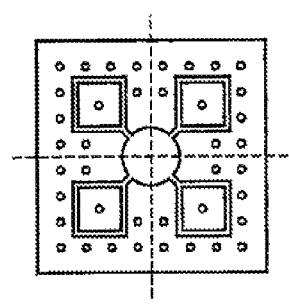
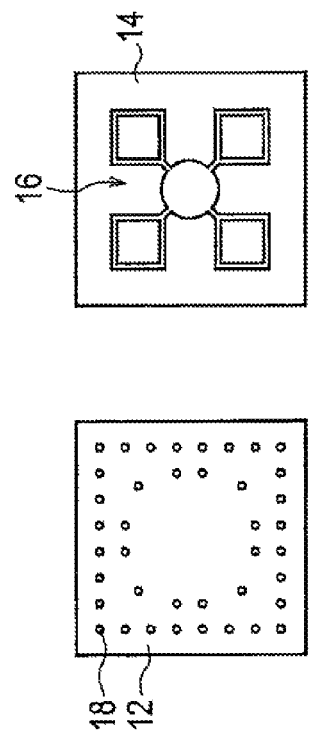
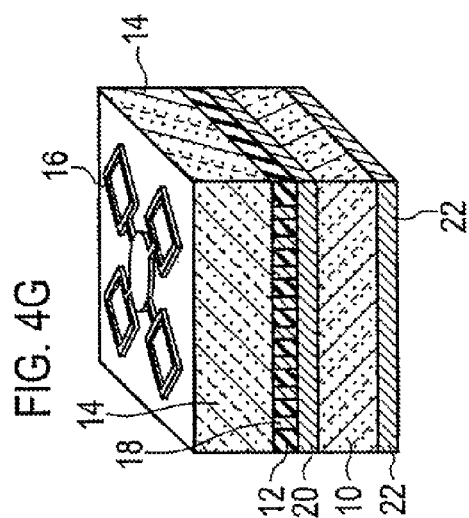
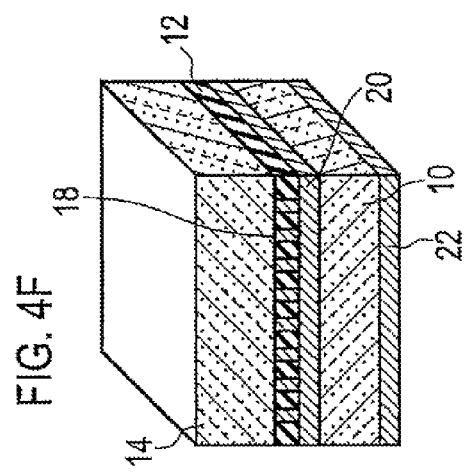
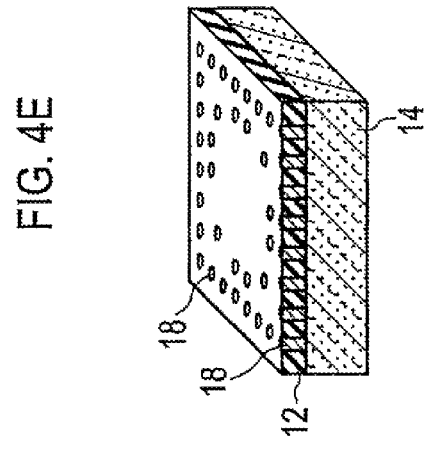
FIG. 4A FIG. 4B FIG. 4C FIG. 4D
FIG. 4E FIG. 4F FIG. 4G

SEMICONDUCTOR LIGHT EMITTING DEVICE AND FABRICATION METHOD OF THE SEMICONDUCTOR LIGHT EMITTING DEVICE

CROSS REFERENCE TO RELATED APPLICATION AND INCORPORATION BY REFERENCE

This is a division of application Ser. No. 12/285,702, filed Oct. 10, 2008. Furthermore, this application claims the benefit of priority of Japanese application number 2007-265763, filed Oct. 11, 2007. The disclosures of both of these prior applications are incorporated herein by reference.

BACKGROUND OF THE INVENTION

1. Field of the Invention

The present invention relates to a semiconductor light emitting device and a fabrication method of the semiconductor light emitting device. In particular, the present invention relates to a semiconductor light emitting device which can control of current and can optimize current density and in which a rise in luminosity is possible, and a fabrication method of the semiconductor light emitting device.

2. Description of the Related Art

In order to perform the rise in luminosity of an LED (Light Emitting Diode), a structure which forms a metallic reflective layer as a reflecting layer of light between a substrate and an active layer composed of an MQW (Multi-Quantum Well) layer is proposed. As a method of forming such the metallic reflective layer, for example, wafer bonding technology of a substrate of a light emitting diode layer is disclosed (for example, refer to the Patent Document 1 and Patent document 2).

On the other hand, an LED which decreases an invalidation light-emitting directly under an electrode relatively, and improves external quantum efficiency by processing pattern shape of surface electrode is also already disclosed (for example, refer to the Patent Document 3 and Patent document 4).

Generally, even if the LED enlarges current density, luminous efficiency does not become large infinitely. This phenomenon occurs according to the cause by which radiative recombination decreases, if temperature rises. Then, it is necessary to apply luminous efficiency into optimal current density for a chip size.

However, when applying high electric current, it is difficult to enlarge a chip size in respect of a size of a product. Moreover, although it is possible to distribute current and to apply optimal current density by connecting a small chip in parallel, the size of a package becomes large, and assembly mounting processes, such as die bonding and wire bonding, become complicated. Therefore, it was impossible to perform the control of the optimal current density in the conventional LED structure.

Patent document 1:
Japanese Patent Application Laying-Open Publication No. Hei06-302857
Patent document 2:
Specification of U.S. Pat. No. 5,376,580
Patent document 3:
Japanese Patent Application Laying-Open Publication No. Hei05-145119
Patent document 4:
Japanese Patent Application Laying-Open Publication No. Hei06-005921

Then, it is a subject to manufacture LED structure of obtaining optimal current density, by fixing a chip size by controlling conduction current, and by a method of not parallel-arranging small chips.

SUMMARY OF THE INVENTION

According to one aspect of the present invention, a semiconductor light emitting device comprising: a semiconductor substrate structure including a semiconductor substrate, a first metal layer placed on a first surface of the semiconductor substrate, and a second metal layer placed on a second surface of the semiconductor substrate; and a light emitting diode structure including a third metal layer placed on the semiconductor substrate structure, a current control layer placed on the third metal layer and composed of a transparent insulating film and a current control electrode, an epitaxial growth layer placed on the current control layer, and a surface electrode placed on the epitaxial growth layer, wherein the semiconductor substrate structure and the light emitting diode structure are bonded by using the first metal layer and the third metal layer, is provided.

According to another aspect of the present invention, a semiconductor light emitting device comprising: an epitaxial growth layer; a surface electrode placed on a first surface of the epitaxial growth layer; a transparent insulating film placed on a second surface of the epitaxial growth layer; a current control electrode placed on the second surface by patterning the transparent insulating film; and a metal layer placed on the transparent insulating film and the current control electrode, is provided.

According to another aspect of the present invention, a fabrication method of a semiconductor light emitting device comprising: preparing a semiconductor substrate; forming a first metal layer on a first surface of the semiconductor substrate; forming a second metal layer on a second surface of the semiconductor substrate; preparing an epitaxial growth layer; forming a transparent insulating film on the epitaxial growth layer; patterning the transparent insulating film and forming a plurality of current control electrodes connected to the epitaxial growth layer; forming a third metal layer on a current control layer composed of the transparent insulating film and the plurality of current control electrodes; and bonding the first metal layer and the third metal layer by thermo-compression bonding, is provided.

According to another aspect of the present invention, a fabrication method of a semiconductor light emitting device comprising: preparing an epitaxial growth layer; forming a transparent insulating film on a first surface of the epitaxial growth layer; patterning the transparent insulating film and forming a current control electrode on the first surface; forming a first metal layer on a current control layer composed of the transparent insulating film and the current control electrode; and forming a second metal layer on a second surface of the epitaxial growth layer.

According to a first embodiment of the present invention, a transparent insulating film is inserted between a substrate and a semiconductor epitaxial growth layer, and a place through which current flows is limited by patterning the transparent insulating film.

According to a second embodiment of the present invention, a transparent insulating film is placed on a semiconductor epitaxial growth layer, and a place through which current flows is limited by patterning the transparent insulating film.

According to the semiconductor light emitting device and the fabrication method of the semiconductor light emitting device of the present invention, a semiconductor light emitting device which can control of current density and can optimize current density and in which a rise in luminosity is possible, and a fabrication method of the semiconductor light emitting device can be provided.

According to the semiconductor light emitting device and the fabrication method of the semiconductor light emitting device of the present invention, a semiconductor light emitting device which can control of current density and can optimize current density and in which a rise in luminosity is possible, by using wafer bonding technology, and a fabrication method of the semiconductor light emitting device can be provided.

BRIEF DESCRIPTION OF DRAWINGS

FIG. 4A is a fundamental explanatory diagram of the semiconductor light emitting device according to the first embodiment of the present invention, and is a plane pattern configuration example of a transparent insulating film of quadric-sectional LED;

FIG. 4B is a fundamental explanatory diagram of the semiconductor light emitting device according to the first embodiment of the present invention, and is a plane pattern configuration example of a surface electrode of quadric-sectional LED;

FIG. 4C is a fundamental explanatory diagram of the semiconductor light emitting device according to the first embodiment of the present invention, and a chart for explaining up-and-down arrangement relationship between a surface electrode of quadric-sectional LED, and a plane pattern of a transparent insulating film;

FIG. 4D is a fundamental explanatory diagram of the semiconductor light emitting device according to the first embodiment of the present invention, and is a schematic circuit configuration chart of the quadric-sectional LED;

FIG. 4E is a fundamental explanatory diagram of the semiconductor light emitting device according to the first embodiment of the present invention, and is a schematic bird's-eye view of a current control layer composed of an epitaxial growth layer 14, a transparent insulating film 12 placed on the epitaxial growth layer 14, and a current control electrode 18;

FIG. 4F is a fundamental explanatory diagram of the semiconductor light emitting device according to the first embodiment of the present invention, and is a schematic bird's-eye view of structure which laminates a semiconductor substrate 10 in which a metal layer is formed on the upper and lower sides, and structure of FIG. 4E, with bonding technology; and FIG. 4G is a fundamental explanatory diagram of the semiconductor light emitting device according to the first embodiment of the present invention, and is a schematic bird's-eye view in which a plane pattern structure of a surface electrode 16 is formed.

DETAILED DESCRIPTION OF THE EMBODIMENTS

Figure 1:
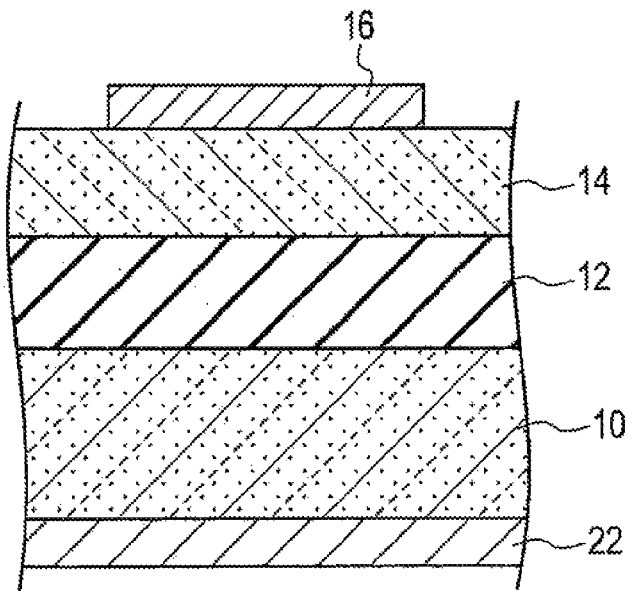
FIG. 1 is a fundamental schematic section structure chart showing a semiconductor light emitting device according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as is conventional in the representation of the circuit blocks, it will be appreciated that the various drawings are not drawn to scale from one figure to another nor inside a given figure, and in particular that the circuit diagrams are arbitrarily drawn for facilitating the reading of the drawings. In the following descriptions, numerous specific details are set forth such as specific signal values, etc. to provide a thorough understanding of the present invention. However, it will be obvious to those skilled in the art that the present invention may be practiced without such specific details. In other instances, circuits well-known have been shown in block diagram form in order to not obscure the present invention with unnecessary detail.

The embodiments shown below exemplify an apparatus and a method that are used to implement the technical ideas according to the present invention, and do not limit the technical ideas according to the present invention to those that appear below. These technical ideas, according to the present invention, may receive a variety of modifications that fall within the claims.

First Embodiment

Basic Element Structure

FIG. 1 shows a fundamental schematic section structure chart of a semiconductor light emitting device according to a first embodiment of the present invention.

As shown in FIG. 1, fundamental schematic section structure of the semiconductor light emitting device according to the first embodiment of the present invention includes: a semiconductor substrate 10, a metal layer 22 placed on a first surface of the semiconductor substrate 10, a transparent insulating film 12 placed on a second surface of the semiconductor substrate 10, an epitaxial growth layer 14 placed on the transparent insulating film 12, and a surface electrode 16 placed on the epitaxial growth layer 14.

A plurality of current control electrodes 18 (FIG. 4) are formed in the transparent insulating film 12 by being patterned as described later, and the semiconductor substrate 10 and the epitaxial growth layer 14 are electrically connected.

The semiconductor substrate 10 and the epitaxial growth layer 14 are formed by using wafer bonding technology as described later.

Figure 2:
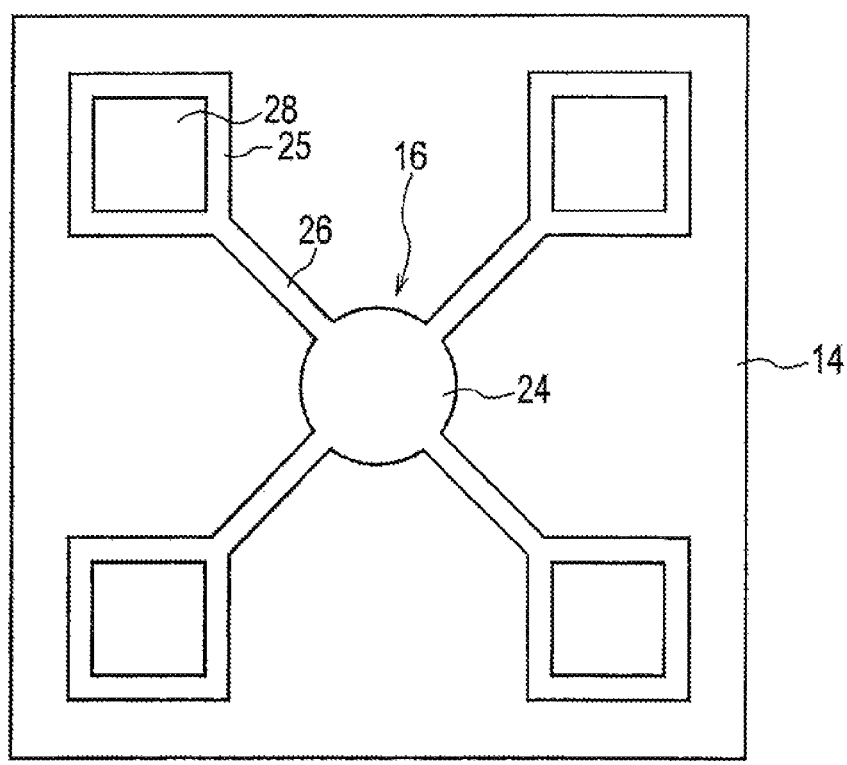
FIG. 2 is a plane pattern configuration diagram showing a surface electrode of a semiconductor light emitting device according to first and second embodiments of the present invention.

FIG. 2 shows a plane pattern configuration example of the surface electrode 16.

The epitaxial growth layer 14 has a rectangular plane pattern, as shown in FIG. 2. The surface electrode 16 includes a center electrode 24 placed on the central part on a rectangular plane pattern, a coupling electrode 26 connected to the center electrode 24 and extended from the center electrode 24 to a rectangular diagonal direction, and a circumference electrode 25 connected to the coupling electrode 26 and placed on the rectangular four corners.

The circumference electrode 25 has the opening 28. In an example of FIG. 2, the opening 28 is a rectangle.

Figure 3:
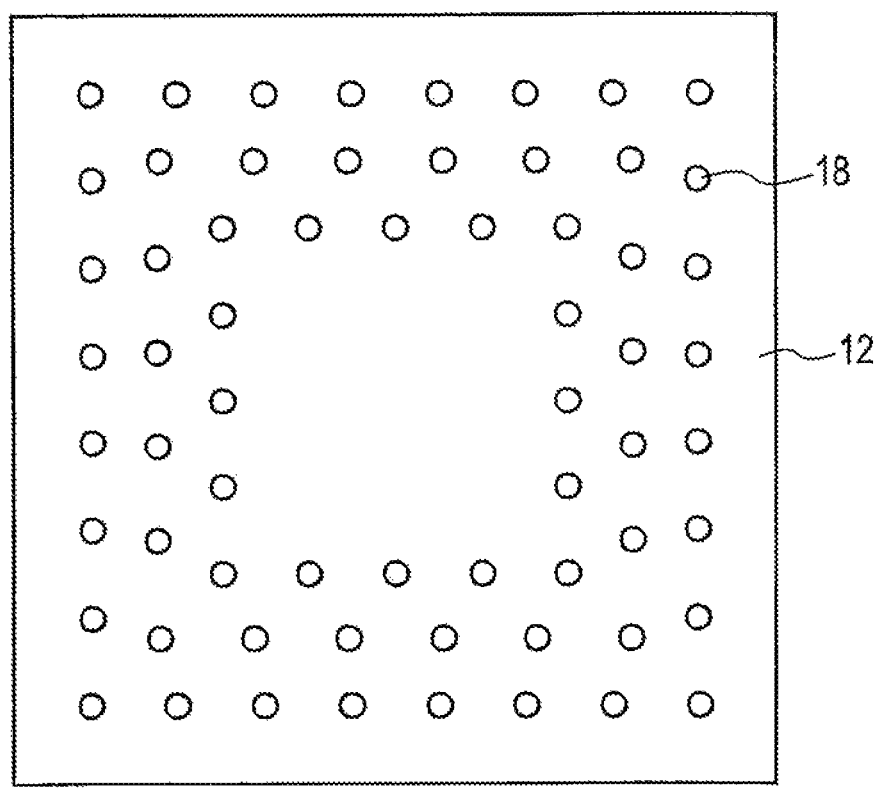
FIG. 3 is a plane pattern configuration diagram showing a transparent insulating film of the semiconductor light emitting device according to the first and second embodiments of the present invention.

FIG. 3 shows a schematic plane pattern configuration example of the transparent insulating film 12.

The current control electrodes 18 are formed in patterned hole parts in the transparent insulating film 12 as shown in FIG. 3. Distribution of the current control electrode 18 is placed so that density may become high in a periphery of the rectangular pattern of the epitaxial growth layer 14, and density may become low in the center portion. That is, in an example of the pattern of the transparent insulating film 12 shown in FIG. 3, the pattern of the current control electrode 18 is placed so that current may not flow into the center portion.

When patterning for current control electrode 18 for reserving ohmic contact after forming the transparent insulating film 12, controllable pattern arrangements of conduction current of LED are applied. Moreover, when forming the surface electrode 16, the surface electrode is formed according to the pattern of the transparent insulating film 12.

By combining with the example of the plane pattern of the surface electrode 16 shown in FIG. 2, it becomes easy to perform conduction of the LED current from the central part on the rectangular plane pattern of the epitaxial growth layer 14 to the circumference electrode 25 direction placed on the four corners.

FIG. 4 is a fundamental explanatory diagram of the semiconductor light emitting device according to the first embodiment of the present invention. FIG. 4A is a plane pattern configuration example of a transparent insulating film of quadric-sectional LED; FIG. 4B is a plane pattern configuration example of a surface electrode of quadric-sectional LED; FIG. 4C is a chart for explaining up-and-down arrangement relationship between a surface electrode of quadric-sectional LED, and a plane pattern of a transparent insulating film; FIG. 4D is a schematic circuit configuration chart of the quadric-sectional LED; FIG. 4E is a schematic bird's-eye view of a current control layer composed of an epitaxial growth layer 14, a transparent insulating film 12 placed on the epitaxial growth layer 14, and a current control electrode 18; FIG. 4F is a schematic bird's-eye view of structure which laminates a semiconductor substrate 10 in which a metal layer is formed on the upper and lower sides, and structure of FIG. 4E, with bonding technology; and FIG. 4G is a schematic bird's-eye view in which a plane pattern structure of a surface electrode 16 is formed.

In the semiconductor light emitting device related to the first embodiment of the present invention, as shown in FIG. 4A, the transparent insulating film 12 and a pattern of a current control layer composed of the current control electrode 18 are used. A pattern of the surface electrode 16 shown in FIG. 4B is used, one LED is virtually divided inside an element, as shown in FIG. 4C, and the divided LED can place as well as the state where four LED is arranged and brightened.

As an example of the chip division, for example as shown in FIG. 4A, in the current control layer (12, 18), resistance of the center portion is raised and a pattern which divides a current route into four is used.

As shown in FIG. 4B, in the pattern of the surface electrode 16, a pattern which passes the current through four paths is used.

As a result, as shown in FIG. 4C and FIG. 4D, the same LED as the state where four LEDs quadric-sected virtually are connected in parallel is composed.
(Formation Method)
(a) First of all, as shown in FIG. 4E, prepare the epitaxial growth layer 14 and form the current control layer (12, 18) composed of the transparent insulating film 12 and the current control electrode 18 on the epitaxial growth layer 14. The transparent insulating film 12 is, for example, composed of silicon dioxide films. The current control electrode 18 is, for example, composed of gold layers.
(b) Next, as shown in FIG. 4F, prepare the semiconductor substrate 10 in which the metal layers 20 and 22 are formed on the upper and lower sides, and bond the structure of FIG. 4E by using bonding technology to laminate. The metal layers 20 and 22 are, for example, composed of gold layers. That is, a current control layer (12, 18) composed of the transparent insulating film 12 and the current control electrode 18 is embedded between the semiconductor substrate 10 and the epitaxial growth layer 14 by using bonding technology. The metal layer 20 used for bonding functions as a golden (Au) mirror layer of the semiconductor light emitting device according to the first embodiment
(c) Next, as shown in FIG. 4G, form plane pattern structure of the surface electrode 16 on the epitaxial growth layer 14. The plane pattern of the surface electrode 16 is formed together with the plane pattern of the current control layer (12, 18) composed of the transparent insulating film 12 and the current control electrode 18.

Figure 5A:
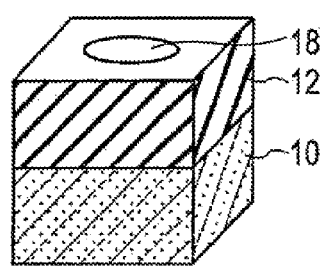
FIG. 5A is a schematic configuration diagram of large LED, in the semiconductor light emitting device according to the first embodiment of the present invention.
Figure 5B:
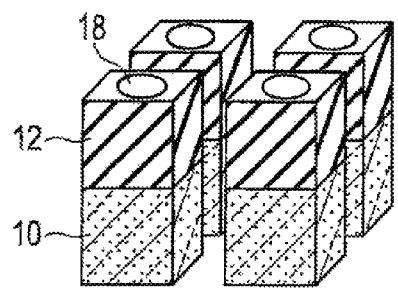
FIG. 5B is a schematic configuration diagram of quadric-sectional LED, in the semiconductor light emitting device according to the first embodiment of the present invention.

As a result, a flow of current can be controlled by using the plane pattern of the current control layer (12, 18), and a semiconductor light emitting device in which the four openings 28 emit light can be obtained.
(Optimization of Chip Size and Current Density)
FIG. 5 shows a schematic configuration diagram of a large LED (FIG. 5A) and a quadric-sectional LED (FIG. 5B), in the semiconductor light emitting device according to the first embodiment of the present invention. Furthermore, FIG. 6 expresses a relation of luminous flux $\Phi_V$ (lm) and forward current $I_F$ (mA) which apply pitch size a parameter, in the semiconductor light emitting device according to the first embodiment of the present invention.

Generally, luminous efficiency $\eta_i$ of LED is expressed with a following formula:

$$\eta_i = B\tau_n(p_0 + n_0 + \tau_n J/qd) \quad (1)$$

where B is a radiative recombination constant, $\tau_n$ is the life time of an electron, $p_0$ is the hole impurity density, $n_0$ is the electron impurity density, J is current density, q is the amount of elementary charge, and d is the thickness of an active layer.

Generally, even if LED enlarges current density, luminous efficiency does not become large infinitely.

Figure 6:
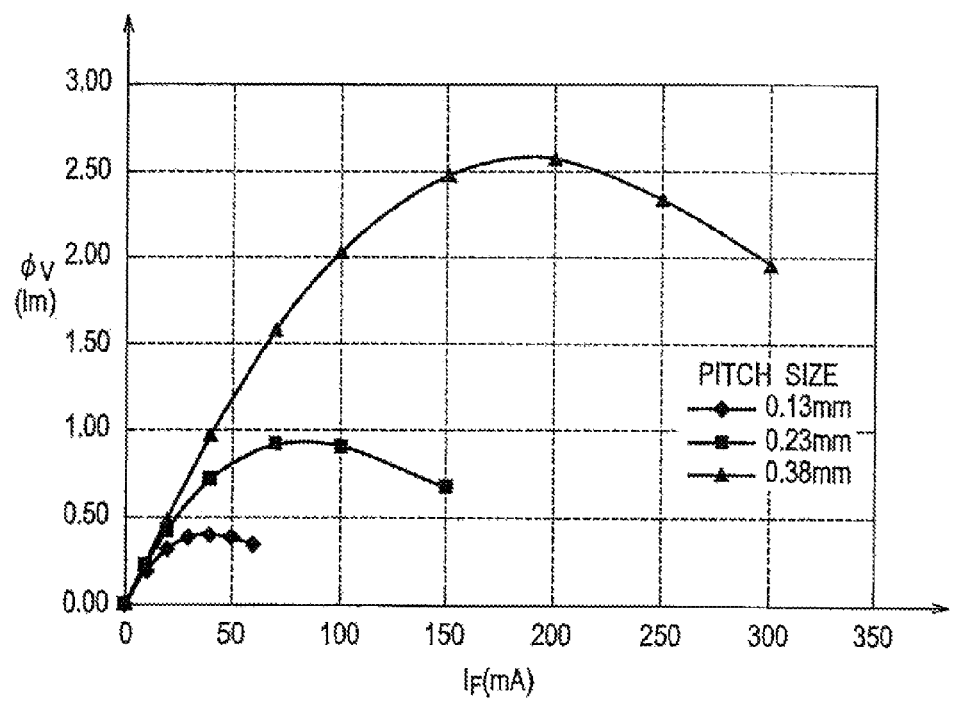
FIG. 6 is a characteristics chart which expresses a relation of luminous flux $\Phi_V$(lm) which applies pitch size a parameter and forward current $I_F$(mA), in the semiconductor light emitting device according to the first embodiment of the present invention.

For example, as shown in FIG. 6, even if forward current density $I_F$ (mA) increases, luminous flux $\Phi_V$ (lm) does not become large infinitely. When pitch size is applied into a parameter, as shown in FIG. 6, the value of luminous flux $\Phi_V$ (lm) has a peak value, and it proves that a value of proper forward current $I_F$ (mA) exists.

As shown in FIG. 6, a reason for having such the peak value is for temperature to rise even if forward current $I_F$ (mA) increases, and for radiative recombination to decrease if the temperature rises.

Then, it is necessary to set the luminous efficiency become the optimal current density for the chip size.

Even if conducting the same current as a whole by optimizing current density of minute LED so that the luminous efficiency of the minute LED divided according to each may become the optimal by using the configuration of sectional LED (FIG. 5B), a rise in luminosity can be achieved as compared with the large LED (FIG. 5A). In addition, the sectional LED's not being limited to quadric-section is clear.

Figure 7:
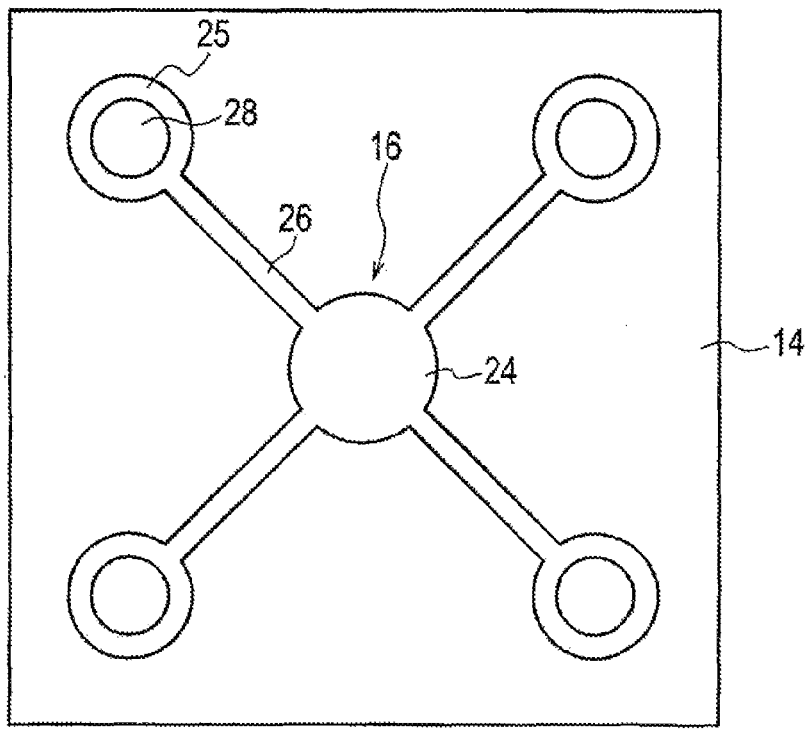
FIG. 7 is another plane pattern configuration diagram showing a surface electrode of the semiconductor light emitting device according to the first and second embodiments of the present invention.
Figure 8:
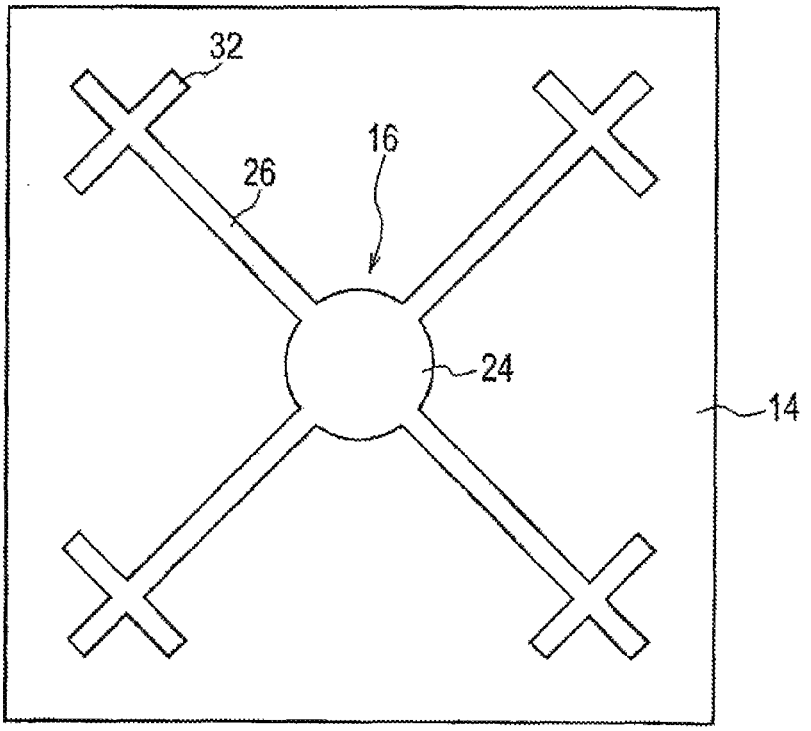
FIG. 8 is another plane pattern configuration diagram showing the surface electrode of the semiconductor light emitting device according to the first and second embodiments of the present invention.

If a plurality of LED is arranged, a plurality of pads for wirebonding is needed, wiring becomes complicated, and difficulty on mounting accompanies. In contrast, in the semiconductor light emitting device according to the first embodiment of the present invention, difficulty on mounting is also cancelable by using the current control layer (12, 18).
(Element Structure)
FIG. 7 shows another plane pattern configuration diagram of the surface electrode of the semiconductor light emitting device according to the first embodiment of the present invention. Moreover, FIG. 8 shows another plane pattern configuration diagram of the surface electrode of the semiconductor light emitting device according to the first embodiment of the present invention.

Figure 9A:
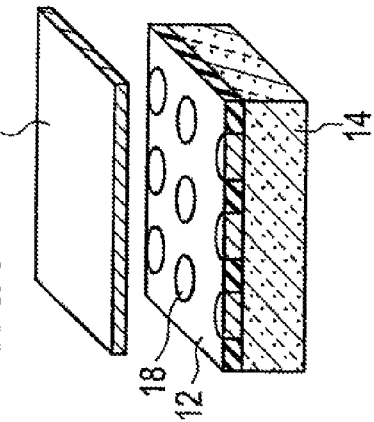
FIG. 9A is an explanatory diagram of a fabrication method of the semiconductor light emitting device according to the first embodiment of the present invention, and is a process chart for forming a current control layer (12, 18) composed of a transparent insulating film 12 and a current control electrode 18 on a epitaxial growth layer 14, and also forming a third metal layer 20.
Figure 9B:
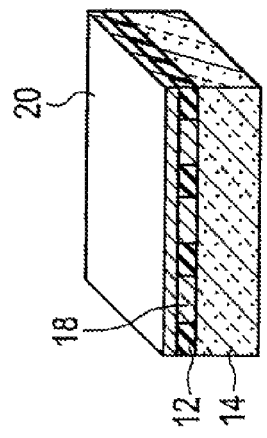
FIG. 9B is an explanatory diagram of the fabrication method of the semiconductor light emitting device according to the first embodiment of the present invention, and is a schematic bird's-eye view of structure in which the third metal layer 20 is formed on the current control layer (12, 18)
Figure 9C:
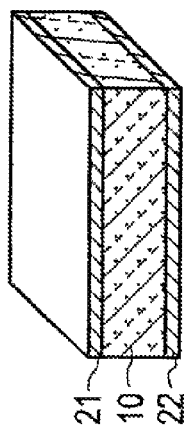
FIG. 9C is an explanatory diagram of the fabrication method of the semiconductor light emitting device according to the first embodiment of the present invention, and is a schematic bird's-eye view of a semiconductor substrate 10 in which a first metal layer 21 and a second metal layer 22 are formed on the upper and lower sides.
Figure 9D:
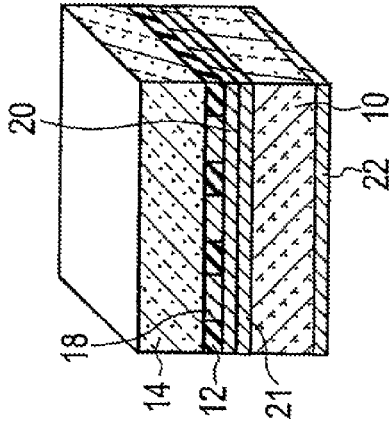
FIG. 9D is an explanatory diagram of the fabrication method of the semiconductor light emitting device according to the first embodiment of the present invention, and is a schematic bird's-eye view of a structure which bonds the third metal layer 20 and the first metal layer 21 by thermocompression bonding.
Figure 9E:
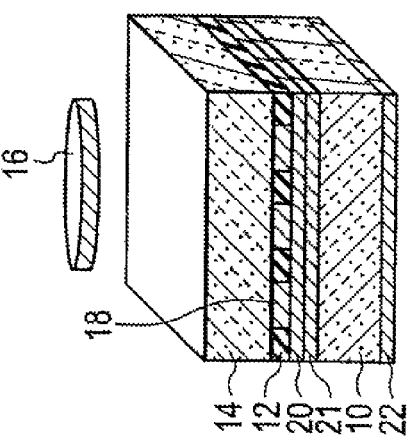
FIG. 9E is an explanatory diagram of the fabrication method of the semiconductor light emitting device according to the first embodiment of the present invention, and is a process chart for forming a pattern of a surface electrode 16 on the epitaxial growth layer 14.
Figure 9F:
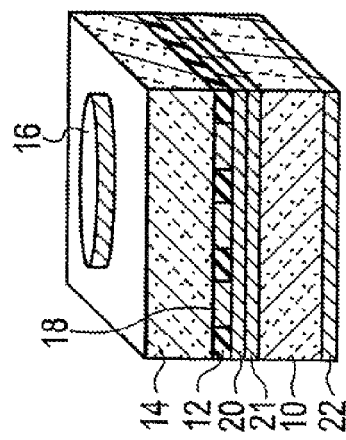
FIG. 9F is an explanatory diagram of the fabrication method of the semiconductor light emitting device according to the first embodiment of the present invention, and is a schematic bird's-eye view of completed structure.

FIG. 9F shows a schematic bird's-eye view of the semiconductor light emitting device according to the first embodiment of the present invention.

As shown in FIG. 9F, the semiconductor light emitting device according to the first embodiment of the present invention includes: the semiconductor substrate structure including the semiconductor substrate 10, the metal layer 21 placed on the first surface of the semiconductor substrate 10, and the metal layer 22 placed on the second surface of the semiconductor substrate 10; the current control layer (12, 18) composed of the metal layer 20 placed on the semiconductor substrate structure, and the transparent insulating film 12 and the current control electrode 18 placed on the metal layer 20; and the light emitting diode structure including the epitaxial growth layer 14 placed on the current control layer (12, 18), and the surface electrode 16 placed on the epitaxial growth layer 14.

The semiconductor light emitting device according to the first embodiment of the present invention bonds the semiconductor substrate structure and the light emitting diode structure by using the metal layer 21 and the metal layer 20.

Moreover, as shown in FIG. 2, FIG. 7, and FIG. 8, the epitaxial growth layer 14 has a rectangular plane pattern, and the surface electrode 16 includes: the center electrode 24 placed on the central part on the rectangular plane pattern; the coupling electrode 26 connected to the center electrode 24 and extended from the center electrode 24 to the rectangular diagonal direction; and the circumference electrode 25 connected to the coupling electrode 26 and placed on the rectangular four corners.

Moreover, the circumference electrode may include the opening 28 as shown in FIG. 2 and FIG. 7.

Moreover, the opening 28 may be a rectangle as shown in FIG. 2.

Moreover, the openings 28 may be a perfect circle, a substantial circle, an oval, an ellipse, etc., as shown in FIG. 7.

Moreover, as shown in FIG. 8, the circumference electrode 32 may be provided with a part which intersects perpendicularly with the coupling electrode 26. Moreover, the circumference electrode 32 may be placed more than one. Moreover, when a plurality of circumference electrodes 32 is placed, the length of the circumference electrode 32 may differ mutually.

Furthermore, although not illustrated at this point, the circumference electrode 32 may be placed at structure of a fractal figure.

The semiconductor light emitting device according to the first embodiment can bond the semiconductor substrate structure and the light emitting diode structure by bonding the first metal layer 21 and the third metal layer 20 by thermo-compression bonding.

Temperature condition of bonding is, for example, about 250 degrees C. to 700 degrees C., or 300 degrees C. to 400 degrees C. preferable. Pressure of thermo-compression bonding is, for example, about 10 MPa to 20 MPa.

Moreover, in the semiconductor light emitting device according to the first embodiment, the semiconductor substrate may be formed by GaAs.

Moreover, in the semiconductor light emitting device according to the first embodiment, all the metal layers 20, 21, and 22, the current control electrode 18, and the surface electrode 16 may be formed by a gold layer.

Moreover, in the semiconductor light emitting device according to the first embodiment, the transparent insulating film 12 may be formed by either a silicon dioxide film, a silicon nitride film, an SiON film, an $SiO_xN_y$ film, or these multilayer films (Fabrication Method)

FIG. 9 is an explanatory diagram of a fabrication method of the semiconductor light emitting device according to the first embodiment of the present invention.

As shown in FIG. 9, the fabrication method of the semiconductor light emitting device according to the first embodiment of the present invention includes: preparing the semiconductor substrate 10; forming the first metal layer 21 on the first surface of the semiconductor substrate 10; forming the second metal layer 22 on the second surface of the semiconductor substrate 10; preparing the epitaxial growth layer 14; forming the transparent insulating film 12 on the epitaxial growth layer 14; patterning the transparent insulating film 12 and forming a plurality of the current control electrodes 18 connected to the epitaxial growth layer 14; forming the third metal layer 20 on the current control layer (12, 18) which is composed of the transparent insulating film 12 and a plurality of current control electrodes 18; and bonding the first metal layer 21 and the third metal layer 20 by thermo-compression bonding.

The fabricating process will be explained in the following.
(a) First of all, as shown in FIG. 9A, form the current control layer (12, 18) composed of the transparent insulating film 12 and the current control electrode 18 on the epitaxial growth layer 14.
(b) Next, as shown in FIG. 9B, form the metal layer 20 on the current control layer (12, 18). The metal layer 20 can be formed, for example, by golden vacuum evaporation.
(c) Next, as shown in FIG. 9C, form the first metal layer 21 and the second metal layer 22 on the upper and lower sides of the semiconductor substrate 10, respectively. The first metal layer 21 and the second metal layer 22 can also be formed, for example, by golden vacuum evaporation.
(d) Next, as shown in FIG. 9D, bond the semiconductor substrate structure and the light emitting diode structure by bonding the third metal layer 20 and the first metal layer 21 by thermo-compression bonding. Temperature condition of bonding is, for example, about 250 degrees C. to 700 degrees C., or 300 degrees C. to 400 degrees C. preferable. Pressure of thermo-compression bonding is, for example, about 10 MPa to 20 MPa.
(e) Next, as shown in FIG. 9E, form the pattern of the surface electrode 16 on the epitaxial growth layer 14. The surface electrode 16 can also be formed, for example, by golden vacuum evaporation.
(f) Finally, as shown in FIG. 9F, obtain the semiconductor light emitting device of completed structure. As a result, a flow of current can be controlled by using the plane pattern of the current control layer (12, 18), and the semiconductor light emitting device in which the four openings 28 emit light can be obtained.

In the fabrication method of the semiconductor light emitting device according to the first embodiment of the present invention, the current control layer (12, 18) composed of the transparent insulating film 12 and a plurality of current control electrodes 18 is made to intervene between the epitaxial growth layer 14 and the semiconductor substrate 10. Such the current control layer (12, 18) cannot be formed by epitaxial growth onto the epitaxial growth layer 14. For this reason, bonding technology is used in the fabrication method of the semiconductor light emitting device according to the first embodiment of the present invention.

The characteristic of such the current control layer (12, 18) is at a point that the current can be applied hard to flow through in particular directly under the central electrode 24 of the surface electrode 16 by intervening material of high resistivity, such as a silicon dioxide film, between the epitaxial growth layer 14 and the semiconductor substrate 10.

According to the first embodiment of the present invention, the semiconductor light emitting device which can control of current density and can optimize current density and in which a rise in luminosity is possible, and the fabrication method of the semiconductor light emitting device can be provided.

According to the first embodiment of the present invention, the semiconductor light emitting device which can control of current density and can optimize current density and in which a rise in luminosity is possible, by using wafer bonding technology, and the fabrication method of the semiconductor light emitting device can be provided.

Second Embodiment

Element Structure

Figure 10A:
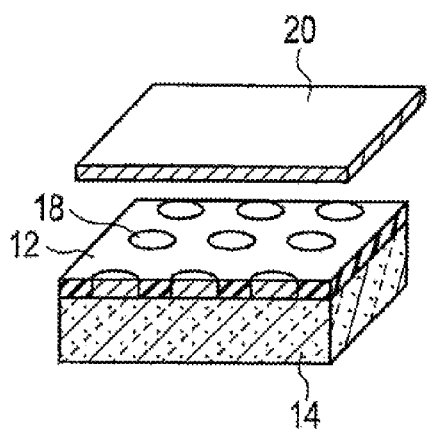
FIG. 10A is an explanatory diagram of a fabrication method of the semiconductor light emitting device according to the second embodiment of the present invention, and is a process chart for forming a current control layer (12, 18) composed of a transparent insulating film 12 and a current control electrode 18 on a epitaxial growth layer 14, and also forming a third metal layer 20.
Figure 10B:
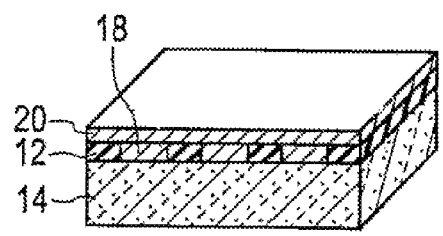
FIG. 10B is an explanatory diagram of the fabrication method of the semiconductor light emitting device according to the second embodiment of the present invention, and is a schematic bird's-eye view of a structure in which the third metal layer 20 is formed on the current control layer (12, 18)
Figure 10C:
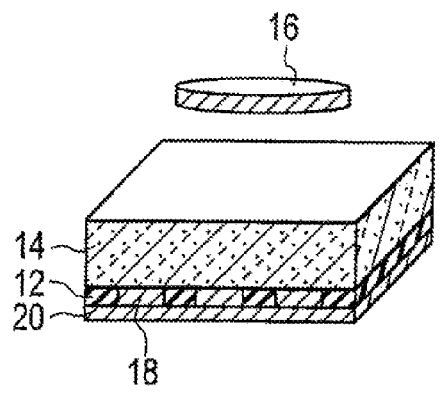
FIG. 10C is an explanatory diagram of the fabrication method of the semiconductor light emitting device according to the second embodiment of the present invention, and is a process chart for forming a pattern of a surface electrode 16 on the epitaxial growth layer 14.
Figure 10D:
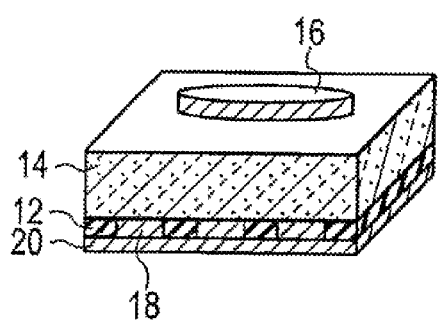
FIG. 10D is an explanatory diagram of the fabrication method of the semiconductor light emitting device according to the second embodiment of the present invention, and is a schematic bird's-eye view of completed structure.

FIG. 10D shows a schematic bird's-eye view of a semiconductor light emitting device according to a second embodiment of the present invention.

As shown in FIG. 10D, the semiconductor light emitting device according to the second embodiment of the present invention includes: an epitaxial growth layer 14; a surface electrode 16 placed on a first surface of the epitaxial growth layer 14; a transparent insulating film 12 placed on a second surface of the epitaxial growth layer 14; a current control electrode 18 patterned the transparent insulating film 12 and placed on the second surface; and a metal layer 20 placed on a current control layer (12, 18) composed of the transparent insulating film 12 and the current control electrode 18.

As shown in FIG. 2, FIG. 7, and FIG. 8, the epitaxial growth layer 14 has a rectangular plane pattern, and the surface electrode 16 includes the center electrode 24 placed on the central part on the rectangular plane pattern, the coupling electrode 26 connected to the center electrode 24 and extended from the center electrode 24 to a rectangular diagonal direction, and the circumference electrodes 22 and 32 connected to the coupling electrode 26 and placed on the four corners of the rectangular plane pattern.

Moreover, the circumference electrode 22 includes the opening 28 as shown in FIG. 2 and FIG. 7.

The opening 28 may be a rectangle as shown in FIG. 2.

Moreover, the openings 28 may be a perfect circle, a substantial circle, or an oval, an ellipse, etc., as shown in FIG. 7.

Moreover, as shown in FIG. 8, the circumference electrode 32 may be provided with a part which intersects perpendicularly with the coupling electrode 26. Moreover, the circumference electrode 32 may be placed more than one. Moreover, when a plurality of circumference electrodes 32 is placed, the length of the circumference electrode 32 may differ mutually.

Furthermore, although not illustrated at this point, the circumference electrode 32 may be placed at structure of a fractal figure.

Moreover, in the semiconductor light emitting device according to the second embodiment of the present invention, the semiconductor epitaxial growth layer may be formed by GaAs.

Moreover, all of the current control electrode 18 and the surface electrode 16 may be formed by a gold layer.

Moreover, in the semiconductor light emitting device according to the second embodiment of the present invention, the transparent insulating film 12 may be formed by either a silicon dioxide film, a silicon nitride film, an SiON film, an $SiO_xN_y$ film, or these multilayer films.

(Fabrication Method)

FIG. 10 is an explanatory diagram of a fabrication method of the semiconductor light emitting device according to the second embodiment of the present invention.

As shown in FIG. 10, the fabrication method of the semiconductor light emitting device according to the second embodiment of the present invention includes: preparing the epitaxial growth layer 14; the transparent insulating film 12 on the first surface of the epitaxial growth layer; patterning the transparent insulating film 12 and forming the current control electrodes 18 on the first surface of the epitaxial growth layer 14; and forming the surface electrode 16 on the second surface of the epitaxial growth layer 14.

The fabricating process will be explained in the following.
(a) First of all, as shown in FIG. 10A, form the current control layer (12, 18) composed of the transparent insulating film 12 and the current control electrode 18 on the epitaxial growth layer 14.
(b) Next, as shown in FIG. 10B, form the metal layer 20 on the current control layer (12, 18).
(c) Next, as shown in FIG. 10C, form the pattern of the surface electrode 16 on the epitaxial growth layer 14.
(d) Finally, as shown in FIG. 10D, obtain the semiconductor light emitting device of completed structure.

According to the second embodiment of the present invention, the semiconductor light emitting device which can control of current density and can optimize current density and in which a rise in luminosity is possible, and the fabrication method of the semiconductor light emitting device can be provided.

Other Embodiments

While the present invention is described in accordance with the aforementioned first to second embodiments, it should not be understood that the description and drawings that configure part of this disclosure are to limit the present invention. With the disclosure, a person skilled in the art might easily think up alternative embodiments, embodiment examples, or application techniques.

In the semiconductor light emitting device and a fabrication method of the semiconductor light emitting device according to the first to second embodiment of the present invention, although a GaAs substrate is mainly explained to an example as the semiconductor substrate, it is available enough in Si, Ge, SiGe, SiC, GaN substrate, or GaN epitaxial substrate on SiC.

Although the LED is mainly explained to an example as the semiconductor light emitting device according to the first to second embodiments of the present invention, a laser diode LD (Laser Diode) may be composed. In the case, VCSEL (Vertical Cavity Surface Emitting Laser Diode), DFB (Distributed Feedback) LD, DBR (Distribution Bragg Reflection) type LD, etc. may be composed.

Moreover, in the semiconductor light emitting device and the fabrication method of the semiconductor light emitting device according to the first to second embodiment of the present invention, although the examples using the epitaxial growth layer of GaAs related are explained, for example, material of AlInGaP related is also applicable.

Such being the case, the present invention covers a variety of embodiments, whether described or not. Therefore, the technical scope of the present invention is appointed only by the invention specific matter related appropriate scope of claims from the above-mentioned explanation.

INDUSTRIAL APPLICABILITY

The semiconductor light emitting device and the fabrication method of the semiconductor light emitting device according to the embodiments of the present invention are available in whole of the semiconductor light emitting device, such as a GaAs substrate, an LED element having an opaque substrate (for example, an Si substrate), and an LD element

What is claimed is:
1. A semiconductor light emitting device comprising:
a conductive substrate structure comprising
    a conductive substrate,
    a first metal layer disposed on a first surface of the conductive substrate, and
    a second metal layer disposed on a second surface of the conductive substrate; and
a light emitting diode structure disposed on the conductive substrate structure, the light emitting diode structure comprising
    a third metal layer,
    a current control layer disposed on the third metal layer, the current control layer composed of a transparent insulating film and a plurality of current control electrodes, the plurality of the current control electrodes being respectively formed in a plurality of through-holes, the plurality of the through-holes respectively being formed so as to pass through the transparent insulating film,
    an epitaxial growth layer disposed on the current control layer, the epitaxial growth layer including a rectangular planar pattern, and
    a surface electrode disposed on the epitaxial growth layer, the surface electrode including a wire bonding electrode and peripheral electrodes connected to the wire bonding electrode, the peripheral electrodes being disposed at four corners of the rectangular planar pattern, each of the peripheral electrodes having an opening,
wherein the conductive substrate structure and the light emitting diode structure are coupled to each other by bonding between the first metal layer and the third metal layer, wherein
the plurality of the current control electrodes are distributed so that a density of the current control electrodes is high in a region not overlapping the wire bonding electrode when viewed from a laminating direction of the epitaxial growth layer, and the density of the current control electrodes is low in a region overlapping the wire bonding electrode when viewed from the laminating direction of the epitaxial growth layer.

2. The semiconductor light emitting device according to claim 1, wherein
the surface electrode further comprises:
coupling electrodes extended from the wire bonding electrode, the coupling electrodes interposed between the wire bonding electrode and the peripheral electrodes.

3. The semiconductor light emitting device according to claim 2, wherein the plurality of the current control electrodes are distributed only over a region not overlapping at least one of the coupling electrodes or the peripheral electrodes when viewed from the laminating direction of the epitaxial growth layer.

4. The semiconductor light emitting device according to claim 1, wherein the openings are each a rectangle.

5. The semiconductor light emitting device according to claim 1, wherein the openings are each substantially circular.

6. The semiconductor light emitting device according to claim 1, wherein the conductive substrate structure and the light emitting diode structure are coupled to each other by bonding the first metal layer and the third metal layer by thermocompression bonding.

7. The semiconductor light emitting device according to claim 1, wherein the conductive substrate is formed of GaAs.

8. The semiconductor light emitting device according to claim 1, wherein the epitaxial growth layer is formed of a GaAs layer.

9. The semiconductor light emitting device according to claim 1, wherein the epitaxial growth layer includes an AlInGaP based material.

10. The semiconductor light emitting device according to claim 1, wherein each of the first metal layer, the second metal layer, the third metal layer, the surface electrode, and the current control electrodes comprises gold.

11. The semiconductor light emitting device according to claim 1, wherein the transparent insulating film is formed of one selected from the group consisting of a silicon dioxide film, a silicon nitride film, an SiON film, an $SiO_xN_y$ film, and multilayer films thereof.

12. The semiconductor light emitting device according to claim 1, wherein the wire bonding electrode is disposed at a central part of the rectangular planar pattern.

13. A semiconductor light emitting device comprising:
a conductive substrate structure comprising
a conductive substrate,
a first metal layer disposed on a first surface of the conductive substrate, and
a second metal layer disposed on a second surface of the conductive substrate; and
a light emitting diode structure disposed on the conductive substrate structure, the light emitting diode structure comprising
a third metal layer,
a current control layer disposed on the third metal layer, the current control layer composed of a transparent insulating film and a plurality of current control electrodes, the plurality of the current control electrodes being respectively formed in a plurality of through-holes, the plurality of the through-holes respectively being formed so as to pass through the transparent insulating film,
an epitaxial growth layer disposed on the current control layer, the epitaxial growth layer including a rectangular planar pattern, and
a surface electrode disposed on the epitaxial growth layer, the surface electrode including a wire bonding electrode and peripheral electrodes connected to the wire bonding electrode, the peripheral electrodes being disposed at four corners of the rectangular planar pattern, each of the peripheral electrodes having an opening,
the conductive substrate structure and the light emitting diode structure are coupled to each other by bonding between the first metal layer and the third metal layer, the plurality of the current control electrodes are distributed only over a region not overlapping the wire bonding electrode when viewed from a laminating direction of the epitaxial growth layer.

14. The semiconductor light emitting device according to claim 13, wherein
the surface electrode further comprises:
coupling electrodes extended from the wire bonding electrode, the coupling electrodes interposed between the wire bonding electrode and the peripheral electrodes.

15. The semiconductor light emitting device according to claim 14, wherein the plurality of the current control electrodes are distributed only over a region not overlapping at least one of the coupling electrodes or the peripheral electrodes when viewed from the laminating direction of the epitaxial growth layer.

16. The semiconductor light emitting device according to claim 13, wherein each of the openings is a rectangle.

17. The semiconductor light emitting device according to claim 13, wherein each of the openings is substantially circular.

18. The semiconductor light emitting device according to claim 13, wherein the conductive substrate structure and the light emitting diode structure are coupled to each other by bonding the first metal layer and the third metal layer by thermocompression bonding.

19. The semiconductor light emitting device according to claim 13, wherein the conductive substrate is formed of GaAs.

20. The semiconductor light emitting device according to claim 13, wherein the epitaxial growth layer is formed of a GaAs layer.

21. The semiconductor light emitting device according to claim 13, wherein the epitaxial growth layer includes an AlInGaP based material.

22. The semiconductor light emitting device according to claim 13, wherein each of the first metal layer, the second metal layer, the third metal layer, the surface electrode, and the current control electrodes comprises gold.

23. The semiconductor light emitting device according to claim 13, wherein the transparent insulating film is formed of one selected from the group consisting of a silicon dioxide film, a silicon nitride film, an SiON film, an $SiO_xN_y$ film, and multilayer films thereof.

24. The semiconductor light emitting device according to claim 13, wherein the wire bonding electrode is disposed at a central part of the rectangular planar pattern.

* * * * *